United States Patent [19]
Eastty et al.

[11] Patent Number: 5,877,971
[45] Date of Patent: *Mar. 2, 1999

[54] DIGITAL SIGNAL PROCESSING

[75] Inventors: Peter Charles Eastty, Oxford; Tetsuya Konishi, Wootton; Conrad Charles Cooke, Witney, all of United Kingdom

[73] Assignees: Sony Corporation, Tokyo, Japan; Sony United Kingdom Limited, Weybridge, England

[ * ] Notice: The term of this patent shall not extend beyond the expiration date of Pat. No. 5,712,808.

[21] Appl. No.: 947,289

[22] Filed: Oct. 7, 1997

Related U.S. Application Data

[63] Continuation of Ser. No. 510,167, Aug. 2, 1995, Pat. No. 5,712,808.

[30] Foreign Application Priority Data

Sep. 20, 1994 [GB] United Kingdom ............. 9418901

[51] Int. Cl.[6] ................................................ G06F 17/10
[52] U.S. Cl. .................. 364/724.02; 333/166; 375/350
[58] Field of Search .................... 364/724.01–724.19; 375/350, 355; 84/603, 661; 333/166

[56] References Cited

U.S. PATENT DOCUMENTS

| | | | |
|---|---|---|---|
| 4,494,214 | 1/1985 | Bernard et al. | 364/724.19 |
| 4,907,484 | 3/1990 | Suzuki et al. | 84/661 |
| 4,912,667 | 3/1990 | Rabenstein | 364/724.13 |
| 5,081,604 | 1/1992 | Tanaka | 364/724.16 |
| 5,081,605 | 1/1992 | Jassen | 364/724.16 |
| 5,121,065 | 6/1992 | Wager | 364/572 |
| 5,146,470 | 9/1992 | Fuji et al. | 375/103 |
| 5,210,705 | 5/1993 | Chauvel et al. | 364/572 |
| 5,270,481 | 12/1993 | Matsunaga et al. | 64/661 |
| 5,712,808 | 1/1998 | Eastty et al. | 364/724.02 |

FOREIGN PATENT DOCUMENTS

| | | |
|---|---|---|
| 0090464 | 10/1983 | European Pat. Off. . |
| 0261848 | 3/1988 | European Pat. Off. . |
| 3621632 | 1/1988 | Germany . |

*Primary Examiner*—Ayaz R. Sheikh
*Assistant Examiner*—Douglas S. Lee
*Attorney, Agent, or Firm*—Frommer, Lawrence & Haug, LLP; William S. Frommer; Dennis M. Smid

[57] ABSTRACT

Digital signal processing (e.g. filtering) apparatus comprises pipelined digital signal processing means for generating each output sample of an output digital signal from input samples of an input digital signal by combining the input samples with a plurality of subsets of a set of filter coefficients associated with that output sample during a respective plurality of sample periods of the input digital signal; and coefficient generating means for supplying sets of filter coefficients to the signal processing means in response to the current state of a filter control signal. The coefficient generating means is operable to supply the plurality of subsets of each set of filter coefficients to the signal processing means during the respective plurality of sample periods of the input digital signal.

4 Claims, 3 Drawing Sheets

5,877,971

DIGITAL SIGNAL PROCESSING

This application is a continuation of application Ser. No. 08/510,167, filed Aug. 2, 1995 now U.S. Pat. No. 5,712,808.

BACKGROUND OF THE INVENTION

1. Field of the Prior Art

This invention relates to digital signal processing.

2. Description of the Prior Art

Digital signal processing devices, such as digital filters, are used to perform signal processing operations on digital representations of sampled analogue signals such as audio signals. A typical application of such a device for use with a digital audio signal is to provide a frequency-dependent gain adjustment, such as a low-pass, band-pass or high-pass filtering operation.

FIG. 1 is a schematic diagram of a previously proposed digital filtering apparatus in which the characteristics (e.g. frequency response or gain) of a digital filter are dependent on the position of a user-operated control, such as a potentiometer. The apparatus of FIG. 1 may form part of, for example, a digital audio mixing console.

In FIG. 1, the analogue position of a potentiometer 10 is detected by a position encoder 20. The position encoder 20 generates a digital position signal 25 representing the position of the potentiometer 10 at regular intervals determined by clock pulses of a sampling clock signal 28. The digital position signal 25 is then passed to a coefficient generator 30 which produces successive sets of filter coefficients 35 (to be convolved with samples of a digital audio signal) in dependence on the current value of the digital position signal 25. Similar position sampling operations are performed in parallel by further position encoders (e.g. an encoder 21) based on the positions of further potentiometers (e.g. a potentiometer 11).

In order to produce the required filter coefficients, the coefficient generator 30 is programmed with data representing the function assigned to the potentiometer 10. For example, the potentiometer 10 may be a simple "gain" control, in which case the coefficient generator 30 generates a set of coefficients 35 which map an increment or decrement in the digital position signal 25 onto a corresponding increment or decrement in the gain of a digital filter using those coefficients 35. The coefficient generator 30 generates a new set of coefficients 35 at regular intervals, being synchronised by clock pulses of a coefficient update clock 38.

In the example shown in FIG. 1, the coefficient generator in fact generates more than one set of coefficients at a time, with each set of coefficients (e.g. a set 36) corresponding to the output of a respective position encoder.

The successive sets of coefficients 35 are supplied to a signal processor 40 which receives an input digital audio signal 42 (e.g. a 44.1 kilohertz or 48 kilohertz 16 bit digital audio signal) and, using the current set of coefficients 35, generates an output filtered digital audio signal 44. For reasons which will be explained below, some of the coefficients 35 are delayed within the signal processor 40 by a delay element 46. The signal processor also receives the further sets of coefficients 36 etc, and performs further processing of the input digital audio signal 42 using those sets of coefficients.

FIG. 2 is a schematic diagram illustrating the operation of the signal processor 40 of FIG. 1.

The signal processor 40 is a pipelined processing device. This means that the signal processor 40 receives a sample of the input digital audio signal 42 in each sample period of the digital audio signal and supplies an output sample of the output digital audio signal 44 at each sample period. However, the processing required to generate an output sample is performed over the course of more than one sample period. This pipelined arrangement is represented schematically in FIG. 2, in which time is represented along the horizontal axis and a number of discrete processing streams within the signal processor 40 (e.g. separate central processing units or CPUs operating in parallel) are represented on the vertical axis.

In FIG. 2 the processing applied to a particular input sample (sample "n") is represented by shaded portions 50, 52 and 54. When sample n is received by the signal processor 40, it is initially processed at various times during a first sample period in a subset of the processing streams represented by the shaded portion 50. In the following sample period the processing of sample n is represented by the shaded portions 52 (the portion 50' in the second sample period illustrated being used to process the next sample n+1). Finally, in the third sample period illustrated in FIG. 2, the processing continues as represented by a shaded portion 54, before the filtered sample n is output by the signal processor 40.

FIG. 3 is a schematic diagram of an infinite impulse response (IIR) digital filter which may be embodied in the signal processor 40. This type of filter is conventional and is described in, for example, the book "Digital Signal Processing" (Proakis and Manolakis, MacMillan Publishing Company, 1992). In this type of filter, an input signal is delayed by successive delay elements ($Z^{-1}$) with the output of various "taps" in the change of delay elements being multiplied by respective filter coefficients c1–c5. The results of the multiplication stages are summed by an adder 60 to generate the filtered output signal.

When a filter of the type illustrated in FIG. 3 is implemented in a pipelined signal processor 40 of the type described above, constraints on the number of processing operations which can be performed during a single sample period often mean that it is impossible to schedule all of the multiply operations used in the generation of a single filtered output sample (i.e. using a single set of coefficients such as the set 35) to take place during the same sample period. This situation is illustrated in FIG. 4, which is a further schematic timing diagram illustrating the operation of the signal processor 40 of FIG. 1.

In FIG. 4, the five multiply operations required to implement the filter of FIG. 3 are split between two successive sample periods 70, 72. In particular, the multiply operations for coefficients c1–c3 of a particular coefficient set are implemented in the sample period 70 and the multiply operations for the coefficients c4 and c5 of that same coefficient set are implemented in the sample period 72.

When the filter response has to be changed (e.g. because the potentiometer 10 has been moved by the user), it is important that all of the filter coefficients c1 to c5 are changed for effectively the same output audio sample, so that the situation does not arise that half of a filtering operation is carried out using one version of a particular set of coefficients and half using an updated version of that set. However, the coefficient generator 30 generates a complete set of coefficients 35 in parallel and at the same time, so this has meant that in the previously proposed apparatus of FIG. 1 a subset of the coefficients has to be delayed so that a particular filtering operation can be completed using a single version of the set of coefficients 35.

In FIG. 4, this situation is illustrated schematically in that a clock pulse (CU) of the coefficient update clock 38 occurs between the sample period 70 and the sample period 72. This means that the current set of coefficients 35 output by the coefficient generator 30 during the sample period 70 is, say, coefficient set (version) n and the set of coefficients output during the sample period 72 is, say, a different coefficient set (version) n+1. The multiplications by coefficients c1 to c3 take place using the coefficient set n during the sample period 70. However, in order that the remaining multiplications (by c4 and c5) are performed using coefficient set n rather than coefficient set n+1, the coefficients c4 and c5 have to be delayed during the sample period 70 for use during the sample period 72.

The situation described above, in which the coefficient generator 30 generates a plurality of complete sets of coefficients 35, 36 together and in parallel but some of those coefficients have to be delayed by the signal processor 40 for use in subsequent sample periods, is wasteful of the available processing resources because (a) the coefficient generator 30 is working needlessly fast, and (b) the implementation of the delay within the signal processor occupies a part of the limited processing and memory resources of the signal processor 40.

SUMMARY OF THE INVENTION

It is an object of the invention to provide an improved digital filtering apparatus.

This invention provides digital filtering apparatus comprising:
- pipelined digital signal processing means for generating each output sample of an output digital signal from input samples of an input digital signal, by combining the input samples with a plurality of subsets of a set of filter coefficients associated with that output sample during a respective plurality of sample periods of the input digital signal; and
- coefficient generating means for supplying sets of filter coefficients to the signal processing means in response to the current state of a filter control signal;
- in which the coefficient generating means is operable to supply the plurality of subsets of each set of filter coefficients to the signal processing means during the respective plurality of sample periods of the input digital signal.

The invention addresses the problems described above by supplying or generating the subsets of a set of filter coefficients required by a pipelined digital signal processor in the correct sample periods for each subset. This avoids the need for the signal processor to receive all of the coefficients of a subset at the same time and then to have to delay some of the coefficients.

It is preferred that the filter control signal results from a user's input (e.g. by moving a gain control linear or rotary potentiometer). Accordingly, it is preferred that the apparatus comprises a filter control input device having a user-adjustable position or orientation; sampling means for sampling the position or orientation of the input device; and means for generating the filter control signal in dependence on a current sampled position or orientation of the input device.

A further problem in the type of filtering apparatus described with reference to FIGS. 1 to 4 is the fact that the sampling clock signal 28 and the coefficient update clock 38 are not synchronised. This can lead to alias effects between the sampling times and the coefficient update times, causing potentially audible artifacts (when the data to be filtered are digital audio data). In order to avoid this problem, it is preferred that the sampling means is operable to sample the position or orientation of the input device in response to clock pulses of a clocking signal; and the coefficient generating means is operable to generate sets of coefficients in response to the clock pulses of the clocking signal (i.e. the same clocking signal as that controlling the sampling means).

Another feature of the apparatus of FIGS. 1 to 4 is that the coefficient generator 30 has to generate all of the sets of coefficients together. In order to alleviate the processing load imposed by this arrangement, it is preferred that the plurality of sets of coefficients are in fact generated in staged groups of sets. To this end it is preferred that the apparatus comprises a plurality of the filter control input devices; and that: the sampling means is operable to sample the position or orientation of each of the filter control input devices; the means for generating is operable to generate a plurality of filter control signals, each in response to a current sampled position or orientation of a respective one of the filter control input devices; and the coefficient generating means is operable to generate a plurality of sets of filter coefficients in response to respective filter control signals and in response to each clock pulse of the clocking signal, the sets of filter coefficients being generated in at least two successive groups of sets.

Preferably the filter control signal is indicative of a required frequency response of the digital filtering apparatus, and/or indicative of a required gain of the digital filtering apparatus.

Viewed from a second aspect this invention provides digital filtering apparatus comprising:
- a filter control input device having a user-adjustable position or orientation;
- sampling means for sampling the position or orientation of the input device in response to clock pulses of a clocking signal;
- coefficient generating means for generating sets of filter coefficients in dependence on the sampled position or orientation of the input device and in response to the clock pulses of the clocking signal; and
- digital signal processing means for generating output samples of an output digital signal from input samples of an input digital signal using the filter coefficients generated by the coefficient generating means.

Viewed from a third aspect this invention provides a digital signal processing apparatus comprising:
- a plurality of control input devices, each having a user-adjustable position or orientation;
- sampling means operable to sample the position or orientation of each of the control input devices;
- means for generating a plurality of control signals, each in response to a current sampled position or orientation of a respective one of the control input devices;
- coefficient generating means operable to generate a plurality of sets of processing control coefficients in response to respective control signals and in response to each clock pulse of a clocking signal, the sets of processing control coefficients being generated in at least two successive groups of sets; and
- signal processing means for processing an input digital signal in response to the sets of processing control coefficients, to generate an output digital signal.

In this aspect, the "sets" of coefficients could indeed be single coefficients, perhaps representing a multiplicative gain control coefficient.

The invention is particularly suitable for use when the input digital signal is a digital audio signal; and the output digital signal is a digital audio signal.

A particularly appropriate application for apparatus according to the invention is an audio mixing console.

Viewed from a fourth aspect this invention provides a method of digital filtering comprising the steps of:

generating each output sample of an output digital signal from input samples of an input digital signal by combining the input samples with a plurality of subsets of a set of filter coefficients associated with that output sample during a respective plurality of sample periods of the input digital signal; and supplying sets of filter coefficients to the signal processing means in response to the current state of a filter control signal;

in which the plurality of subsets of each set of filter coefficients are supplied to the signal processing means during the respective plurality of sample periods of the input digital signal.

Viewed from a fifth aspect this invention provides a method of digital filtering comprising the steps of:

sampling the user-adjustable position or orientation of a filter control input device in response to clock pulses of a clocking signal;

generating sets of filter coefficients to the signal processing means in dependence on the sampled position or orientation of the input device and in response to the clock pulses of the clocking signal; and generating output samples of an output digital signal from input samples of an input digital signal using the filter coefficients generated by the coefficient generating means.

Viewed from a sixth aspect this invention provides a method of digital signal processing, comprising the steps of:

sampling the user-adjustable position or orientation of a plurality of control input devices;

generating a plurality of control signals, each in response to a current sampled position or orientation of a respective one of the control input devices;

generating a plurality of sets of processing control coefficients in response to respective control signals and in response to each clock pulse of a clocking signal, the sets of processing control coefficients being generated in at least two successive groups of sets; and processing an input digital signal in response to the sets of processing control coefficients, to generate an output digital signal.

BRIEF DESCRIPTION OF THE DRAWINGS

The above and other objects, features and advantages of the invention will be apparent from the following detailed description of illustrative embodiments which is to be read in connection with the accompanying drawings, in which.

DESCRIPTION OF THE PREFERRED EMBODIMENTS

Figure 1:
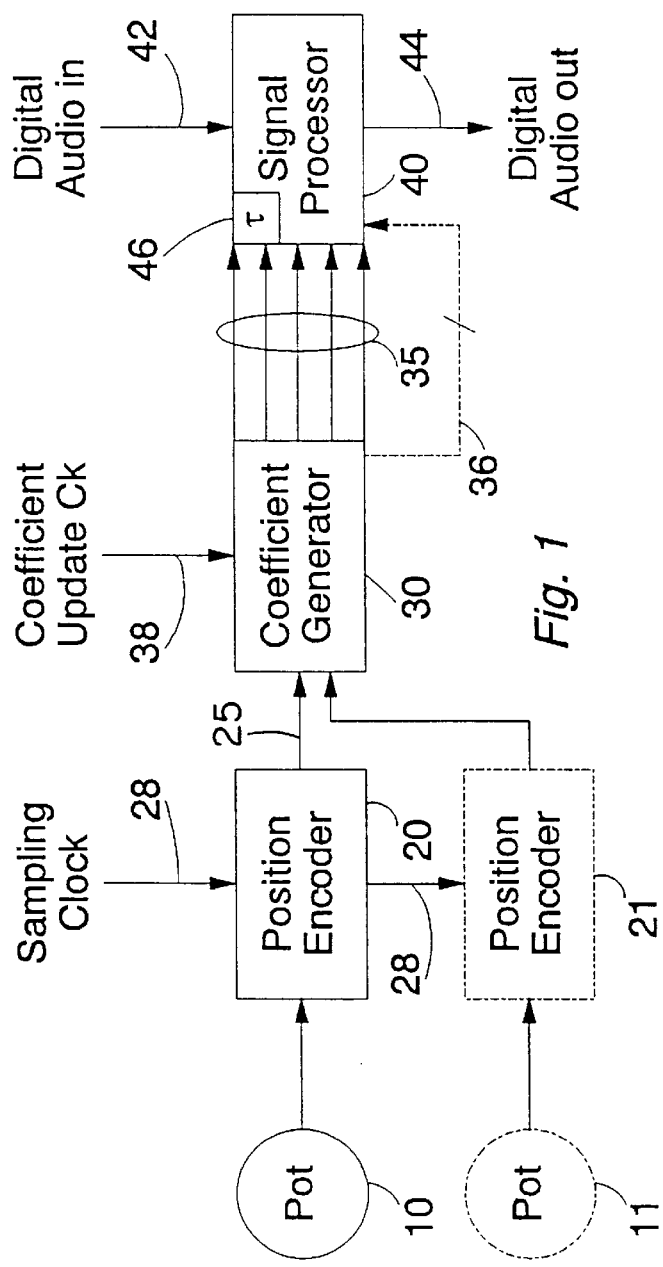
FIG. 1 is a schematic diagram of a previously proposed digital filtering apparatus.
Figure 2:
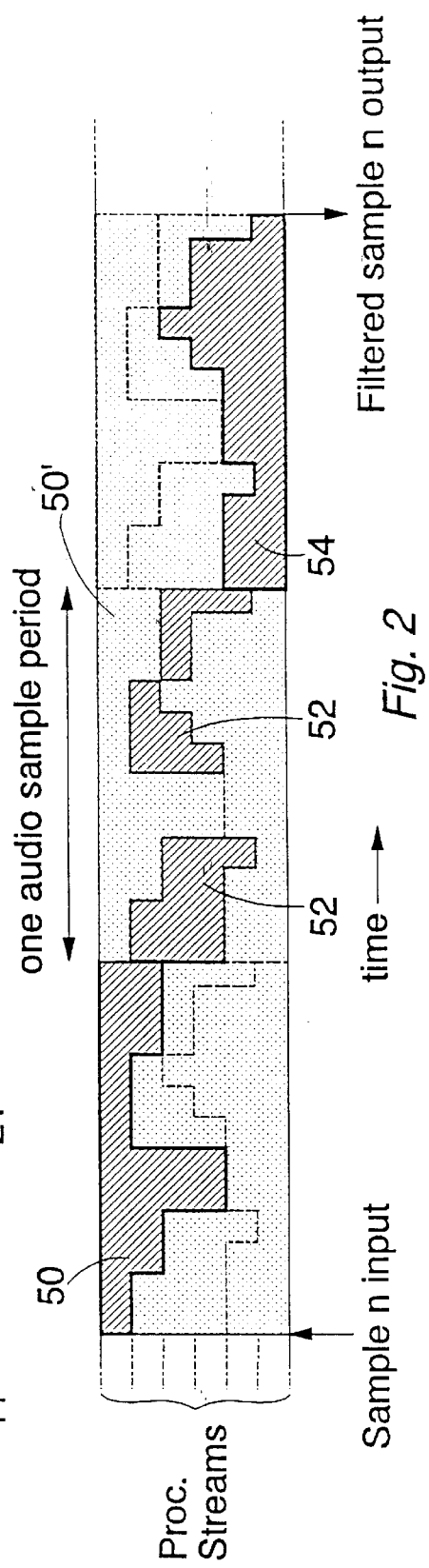
FIG. 2 is a schematic timing diagram illustrating the operation of a pipelined signal processor in the apparatus of FIG. 1.
Figure 3:
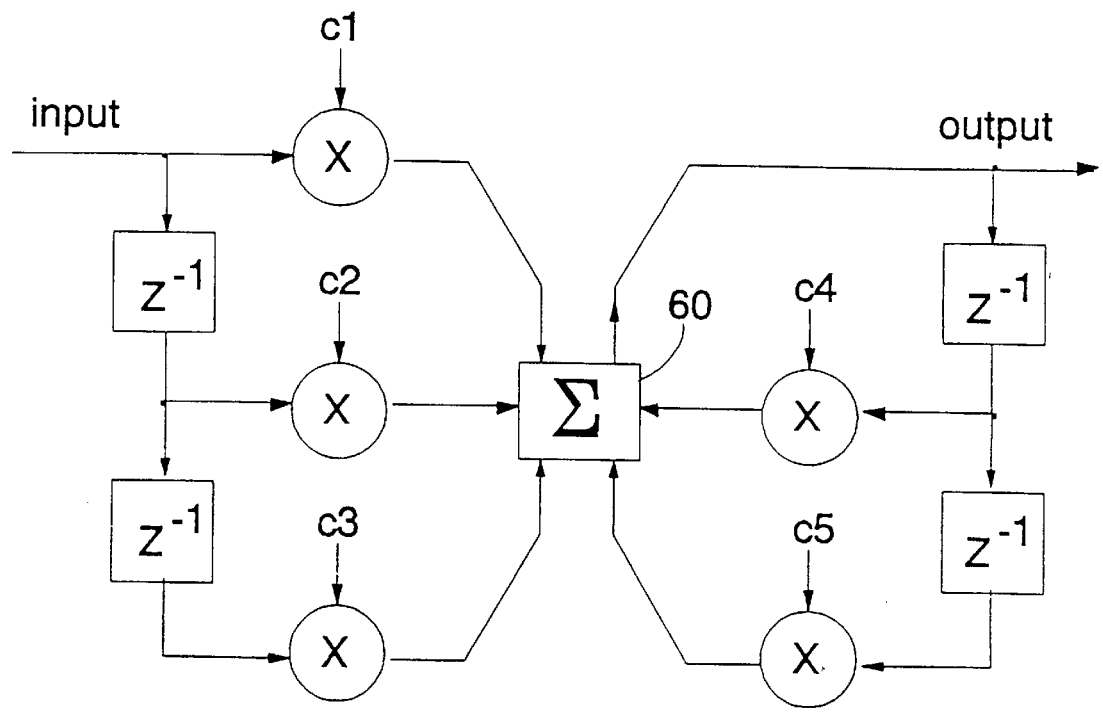
FIG. 3 is a schematic diagram of an infinite impulse response digital filter.
Figure 5:
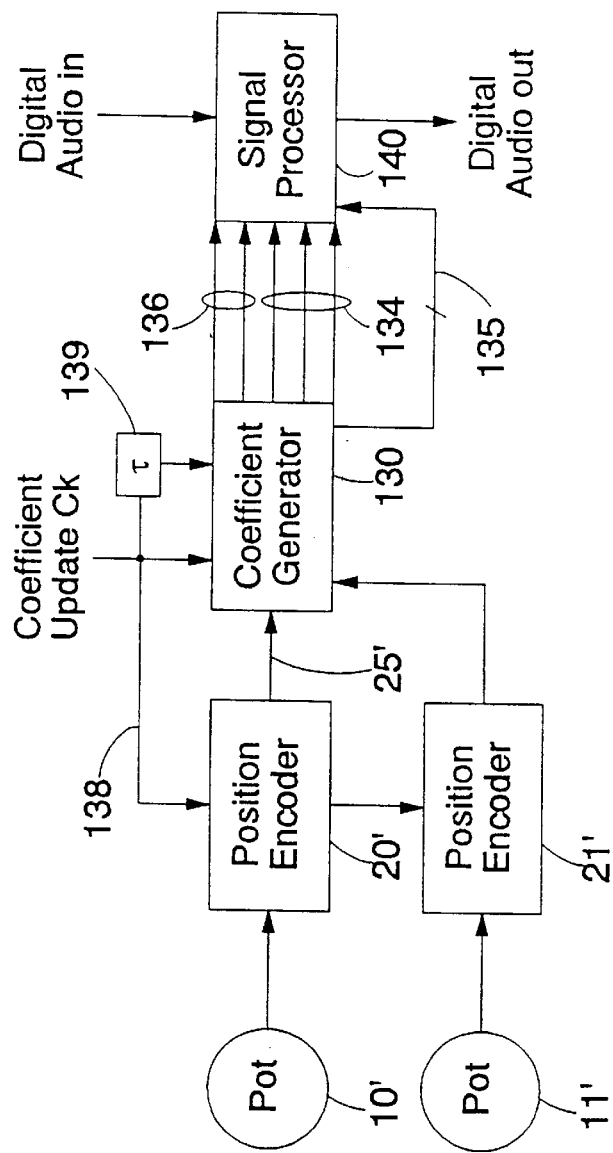
FIG. 5 is a schematic diagram of a digital filtering apparatus according to an embodiment of the invention. This apparatus forms part of one audio channel of a multi-channel digital audio mixing console.

In the apparatus of FIG. 5, user-operated potentiometers or sliders 10', 11', similar to the potentiometers 10, 11 of FIG. 1, are connected to position encoders 20', 21' (again, similar to the position encoders 20, 21 of FIG. 1).

The position encoder 20' generates a digital position signal 25' which is supplied to a coefficient generator 130. In contrast to FIG. 1, however, the position encoder 20' and the coefficient generator 130 are under the control of a single clock signal, namely a coefficient update clock signal 138. This means that the scanning and sampling of the position of the potentiometer 10 is synchronised with the generation of new sets of filter coefficients by the coefficient generator 130. This avoids the audible artifacts described above which can occur when the position encoding is asynchronous with coefficient generation.

The position encoder 21' also generates a respective digital position signal in response to the clock signal 138. However, the coefficient generator generates a set of coefficients corresponding to the output of the encoder 21' in response to a delayed version of the clock signal 138, supplied by a delay element 139. In this way, the coefficient generator 130 outputs two successive groups of coefficient sets, to reduce the instantaneous processing requirements of the coefficient generator 130.

Naturally, it will be appreciated that in the case of a simple multiplicative gain control, a "set" of coefficients may comprises only one coefficient. In this case, the processing applied to the input signal may be referred to simply as "digital signal processing", rather than as "filtering". Similarly, it will be appreciated that the input devices 10', 11' may be simple switches or buttons, whose position is regularly sampled by the position encoders 20', 21'.

The generation of successive groups of the coefficient sets has been described above. These groups might be generated, for example, 500 audio sample periods apart and relate to different processing operations and input devices. The following description refers to a different feature of the apparatus of FIG. 5, namely the staged generation of a single set of coefficients, to avoid the need to delay the coefficients within the signal processor 140.

In contrast to the coefficient generator 30 of FIG. 1, the coefficient generator 130 supplies at least two subsets of a set of coefficients required for a filtering operation to a pipelined signal processor 140 (in response to the digital position signal 25'). A first subset of coefficients 134 is supplied immediately following a clock pulse of the coefficient update clock 138 and represents those coefficients (in the present examples, c1 to c3) for which multiply operations are carried out in the first of a group of sample periods. The other subset 136 illustrated in FIG. 5 comprises, in this example, the coefficients c4 and c5 which are supplied to the signal processor 140 one audio sample period later than the coefficient subset 134.

Figure 6:
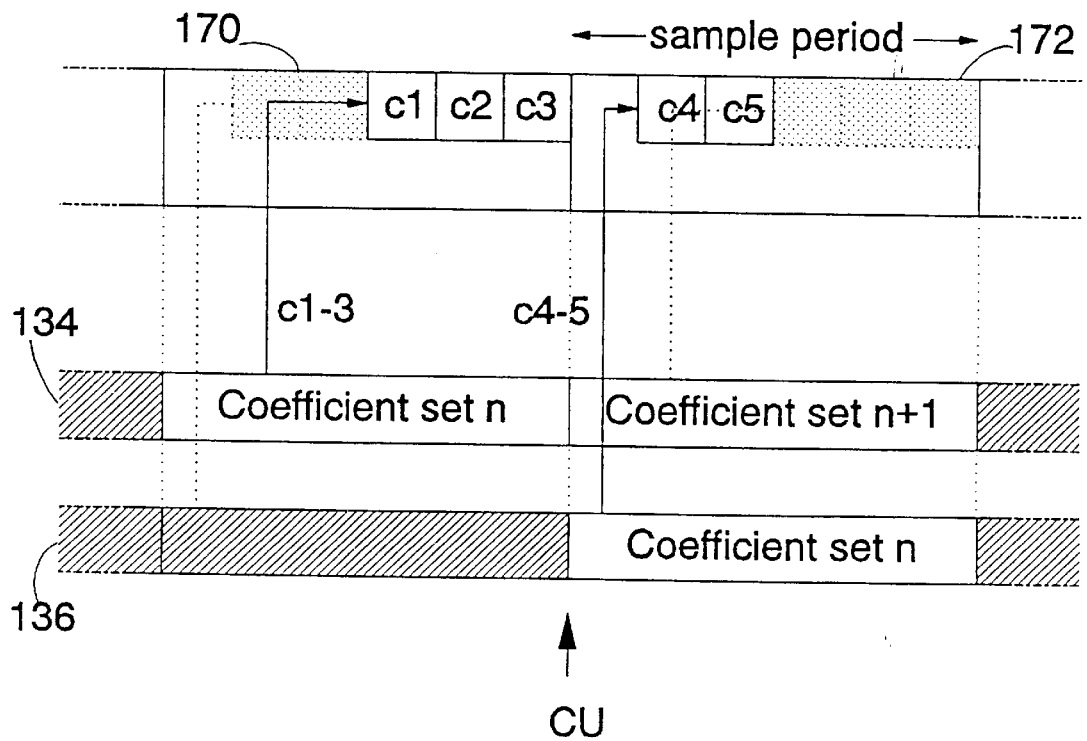
FIG. 6 is a schematic timing diagram illustrating the operation of the apparatus of FIG. 5.

FIG. 6 is a schematic timing diagram illustrating the operation of the coefficient generator 130 and the signal processor 140 of FIG. 5.

Figure 4:
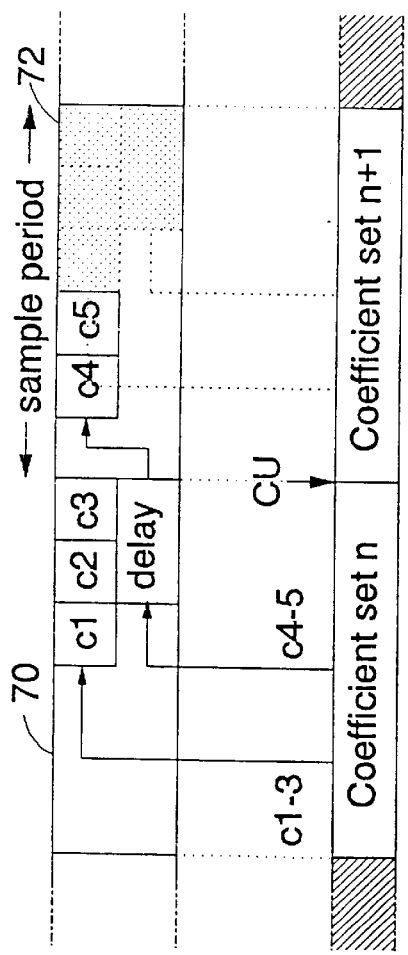
FIG. 4 is a schematic timing diagram illustrating the operation of the apparatus of FIG. 1.

As in the case of FIG. 4, the five multiply operations required to generate a filtered output sample are split between two successive audio sample periods 170, 172. In the sample period 170, multiply operations for the coefficients c1 to c3 are performed using the subset 134 of the current coefficient set (coefficient set n) generated by the coefficient generator 130.

Between the sample periods 170 and 172, a clock pulse (CU) of the coefficient update clock 138 occurs so the subset 134 is updated to part of a new coefficient set n+1. However, the updating of the subset 136 is delayed by the coefficient generator 130 so that coefficients c4 and c5 from the coefficient set n are supplied to the signal processor 140 for use during the sample period 172. At the end of the sample period 172, the subset 136 is also updated to the coefficient set n+1.

The arrangement illustrated in FIGS. 5 and 6 means that the coefficients used by the signal processor 140 are updated "just in time" and so do not need to be delayed within the signal processor 140. This can be achieved in several different ways. For example, the coefficient generator 130 could incorporate single or multiple sample period delay elements in its output signal path. Alternatively, the coefficient generator 130 could operate in a pipelined fashion similar to the signal processor 140, so that only those coefficients (of the subset 134) which are required immediately are generated immediately, with the generation of the remaining coefficients being deferred by the appropriate number of sample periods. This has the additional advantage of reducing the processing requirements of the coefficient generator 130.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. Digital signal processing apparatus comprising:
   a plurality of control input devices, each having a user-adjustable position or orientation;
   sampling means operable to sample said position or orientation of each of said control input devices;
   means for generating a plurality of control signals, each in response to a current sampled position or orientation of a respective one of said control input devices;
   coefficient generating means including means for receiving a clocking signal and means for delaying the received clocking signal so as to form a delayed clocking signal for generating first and second sets of processing control coefficients in response to respective control signals and in response to the clocking signal and the delayed clocking signal and for outputting the same such that said first set of processing control coefficients are outputted during a first sample period and said second set of processing control coefficients are outputted during a second sample period which is subsequent to said first sample period; and
   signal processing means for processing an input digital signal in response to said first and second sets of processing control coefficients to generate an output digital signal.

2. Apparatus according to claim 1, in which:
   said input digital signal is a digital audio signal; and
   said output digital signal is a digital audio signal.

3. An audio mixing console comprising apparatus according to claim 2.

4. A method of digital signal processing, comprising the steps of:
   sampling a user-adaptable position or orientation of a plurality of control input devices;
   generating a plurality of control signals, each in response to a current sampled position or orientation of a respective one of said control input devices;
   receiving a clocking signal and delaying the received clocking signal so as to form a delayed clocking signal;
   generating first and second sets of processing control coefficients in response to respective control signals and in response to the clocking signal and the delayed clocking signal and outputting the same such that said first set of processing control coefficients are outputted during a first sample period and said second set of processing control coefficients are outputted during a second sample period which is subsequent to said first sample period; and
   processing an input digital signal in response to said first and second sets of processing control coefficients to generate an output digital signal.

* * * * *